(12) United States Patent
Colarossi et al.

(10) Patent No.: US 11,624,768 B2
(45) Date of Patent: Apr. 11, 2023

(54) CONSTANT POWER CIRCUIT WITH VARIABLE HEATING AND MEASUREMENT CURRENT CAPABILITY

(71) Applicant: VEONEER US, INC., Southfield, MI (US)

(72) Inventors: Vincent Colarossi, Dearborn Heights, MI (US); Grant Scott, III, South Lyon, MI (US)

(73) Assignee: Veoneer US, LLC, Southfield, MI (US)

( * ) Notice: Subject to any disclaimer, the term of this patent is extended or adjusted under 35 U.S.C. 154(b) by 1022 days.

(21) Appl. No.: 16/165,540

(22) Filed: Oct. 19, 2018

(65) Prior Publication Data
US 2020/0124658 A1 Apr. 23, 2020

(51) Int. Cl.
*G01R 31/26* (2020.01)
*H03F 3/45* (2006.01)

(52) U.S. Cl.
CPC ..... *G01R 31/2621* (2013.01); *H03F 3/45071* (2013.01); *H03F 2200/129* (2013.01); *H03F 2200/297* (2013.01); *H03F 2200/471* (2013.01); *H03F 2203/45051* (2013.01); *H03F 2203/45116* (2013.01); *H03F 2203/45631* (2013.01)

(58) Field of Classification Search
CPC ........... G01R 31/2621; H03F 2200/129; H03F 2200/297; H03F 2200/408; H03F 2200/471; H03F 2203/45051; H03F 2203/45116; H03F 2203/45138; H03F 2203/45526; H03F 2203/45631; H03F 3/45071; H03F 3/45475
See application file for complete search history.

(56) References Cited

U.S. PATENT DOCUMENTS

| | | | | |
|---|---|---|---|---|
| 5,977,651 A | * | 11/1999 | Ueda | B60R 21/017 180/271 |
| 6,456,915 B1 | * | 9/2002 | Fendt | B60R 21/017 180/274 |
| 2002/0140410 A1 | * | 10/2002 | Rothleitner | H02M 3/1582 323/282 |
| 2005/0225925 A1 | * | 10/2005 | Sibrai | B60R 21/0173 361/247 |

* cited by examiner

*Primary Examiner* — Son T Le
*Assistant Examiner* — Adam S Clarke
(74) *Attorney, Agent, or Firm* — Dickinson Wright PLLC

(57) ABSTRACT

A system for testing a subject transistor with constant power. The system may include an amplifier, a measurement voltage source, and a exercise voltage source. The amplifier may have an output connected to a gate of the subject transistor. The amplifier may have a first input and a second input. The measurement voltage source may be connected to the first input of the amplifier for use in measuring characteristics of the subject transistor. The exercise voltage source may be connected to the first input of the amplifier for exercising the subject transistor. The second input of the amplifier may be connected to a source of the subject transistor through a resistor.

18 Claims, 3 Drawing Sheets

CONSTANT POWER CIRCUIT WITH VARIABLE HEATING AND MEASUREMENT CURRENT CAPABILITY

FIELD OF THE DISCLOSURE

This disclosure is related to a constant power circuit for testing transistors.

BACKGROUND

Restraint control modules rely on incorporating modules, such as transistors, with certain characteristics. However, transistors may have varying characteristics due to material inconsistencies, manufacturing inaccuracies, or damage during handling. The variations between transistors may cause certain difficulties in the manufacturing of some devices, such as restraint control modules.

BRIEF SUMMARY

A system for testing a subject transistor with constant power. The system may include an amplifier, a measurement voltage source, and a exercise voltage source. The amplifier may have an output connected to a gate of the subject transistor. The amplifier may have a first input and a second input. The measurement voltage source may be connected to the first input of the amplifier for use in measuring characteristics of the subject transistor. The exercise voltage source may be connected to the first input of the amplifier for exercising the subject transistor. The second input of the amplifier may be connected to a source of the subject transistor through a resistor.

DETAILED DESCRIPTION OF THE DRAWINGS AND THE PRESENTLY PREFERRED EMBODIMENTS

Power transistors are used in restraint modules for control of restraint deployment. One challenge may include establishing the placement of the correct power MOSFETs in a restraint module at time of module fabrication. The solution may include providing an in-circuit method to exercise the power MOSFET from a thermal point of view in the common source configuration, which is the safest way to not impact other circuits in the design. The disclosed circuit provides constant power dissipation to the device under test with variable heating and measurement current capability to provide the heating and temperature measurement properties to facilitate an in-circuit test method.

Figure 1:
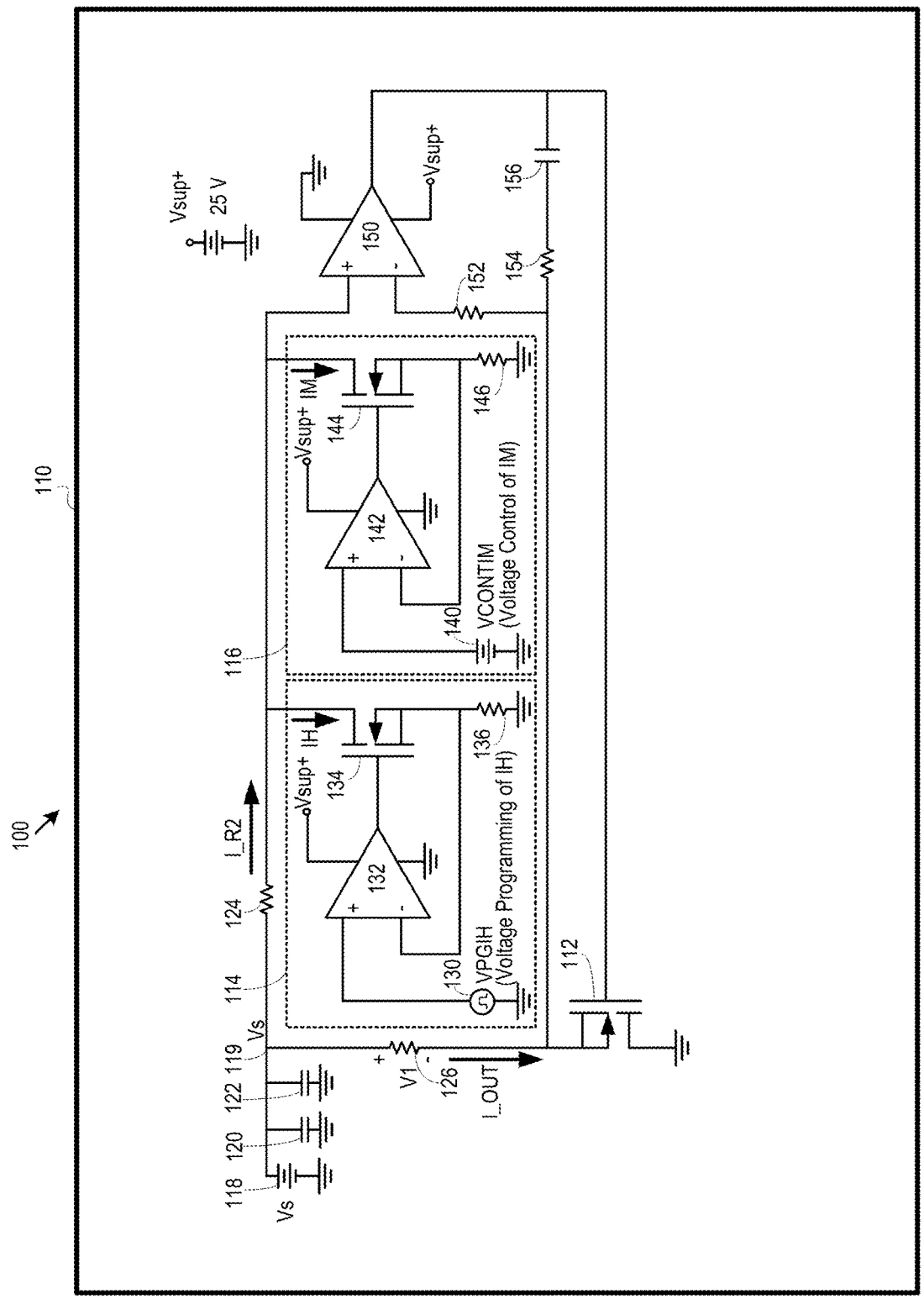
FIG. 1 is a schematic view of a constant power circuit for testing transistors.

FIG. 1 is a schematic view of a constant power circuit for testing transistors. The test circuit 100 may be implemented on an integrated chip such as an ASIC. However, in alternative implementations, the circuit may be generated from discrete components laid out on a circuit board, or using other known formats. A subject transistor 112 may be connected to the test circuit 100. The transistor 112 may be a discrete component that is inserted into a socket or the circuit may include test leads to probe or clip conductors onto each lead of the transistor 112, or in other embodiments, the transistor 112 may be integrated into a silicon chip and the test circuit may also be integrated into the same silicon chip.

In one implementation, transistor 112 is a switch that is used for firing a passenger restraint such as an airbag. In such applications, the characteristics of the transistor 112 may need to be known over a wide range of operating conditions such as temperature, noise, and current variability. The transistor 112 may interface with an exercise circuit 114 and a measurement circuit 116. The test circuit 100 may also include a power supply 118 with one or more capacitors in parallel with the power supply between a first node 119 and electrical ground. For example, capacitor 120 and capacitor 122 may be in parallel with the power supply 118 between node 119 and ground.

A resistor 126 may be placed between node 119 and the drain of transistor 112. The source of transistor 112 may be connected to ground. The output of the exercise circuit 114 and the output of the measurement signal circuit 116 may be connected to node 119 through resistor 124. In addition, the output of exercise circuit 114 and measurement signal circuit 116 may be connected to an input (e.g., the positive input) of amplifier 150.

The exercise circuit 114 may include a exercise voltage source 130 (e.g. a variable square wave source). The exercise voltage source 130 may be connected to a first input (e.g., a positive input) of amplifier 132. The output of the amplifier 132 may be connected to the gate of transistor 134. The second input (e.g., a negative input) of amplifier 132 may be connected to the source of transistor 134. In addition, the source of transistor 134 may be connected to electrical ground through resistor 136. The output of the exercise circuit 114 may be connected to the drain of transistor 134.

The measurement circuit 116 may include a measurement voltage source 140 that may be a direct current voltage source. The measurement voltage source 140 may be connected to a first input (e.g., a positive input) of amplifier 142. The output of amplifier 142 may be connected to the gate of transistor 144. The second input (e.g., a negative input) of amplifier 142 may be connected to the source of transistor 144. Additionally, the source of transistor 144 may be connected to electrical ground through resistor 146. The output of circuit 116 may be connected to the drain of transistor 144. Both amplifier 132 and amplifier 142 may also be connected to a source voltage (VSUP+) and an electrical ground to power each respective amplifier. The output of amplifier 150 is connected to gate of transistor 112. Additionally, the second input (e.g., the negative input) of amplifier 150 is connected to the drain of transistor 112 through resistor 152. In addition, the drain of transistor 112 may be connected to the gate of transistor 112 through resistor 154 and capacitor 156.

A measurement circuit 116 may be to measure various characteristics of the transistor 112. The measured characteristics may include gate to source voltage (Vgs), Power dissipation (Pd), or change in thermal resistance.

The circuit may be analyzed mathematically below; where R1 is resistor 126, R2 is resistor 124, R3 is resistor 146, R4 is resistor 136, I_R2 is the current through resistor R2, IOUT is the current generated through resistor 126 (R1), Vs is the voltage at node 119; V+ is the voltage at the first input (e.g. positive input) of amplifier 150; V− is the voltage at the second input (e.g. negative input) of amplifier 150; V1 is the voltage across R1 (resistor 126); VCONTIM is the voltage provided by voltage source 140, 'VPG1H is the voltage provided by voltage source of 130, IM is the current through transistor 144, IH is the current through transistor 134, Pd is the power dissipated in transistor 112, Vds is the voltage across transistor 112.

$$IOUT*R1 = Vs - V1$$

$$Vs - I\_R2*R2 = V-$$

$$Vs - IOUT*R1 = V+$$

$V- = V+$ due to error amplifier $$Vs - I\_R2*R2 = Vs - IOUT*R1$$

Solving for IOUT yields:

$$IOUT = (I\_R2*R2)/R1 \text{ where } I\_R2 = IM + IH$$

$$IM = VCONTIM/R3 \text{ and } IH = VPGIH/R4$$

$$I\_R2 = (VCONTIM/R3) + (VPGIH/R4)$$

substitution of I_R2 yields:

$$IOUT = (((VCONTIM/R3) + (VPGIH/R4))*R2)/R1$$

$$IOUT = VCONTIM*(R2/(R1*R3)) + VPGIH*(R2/(R1*R4))$$

If R1=1 Ohm, R2=50 Ohm, R3=10 k Ohm R4=50 Ohm $$IOUT = VCONTIM*(50/(1*10\text{ k})) + VPGIH*(50/(1*50))$$

$$IOUT = (VCONTIM*0.005 \text{ A/V}) + (VPGIH*1.0 \text{ A/V})$$

$$Pd = Vds*IOUT$$

$$Pd = (Vs - (IOUT*R1))*IOUT$$

if Vs=Constant, R1=Const, IOUT=Const
Then Pd=Constant

Accordingly, the power dissipated through the tested transistor 112 is shown to be constant.

Figure 2:
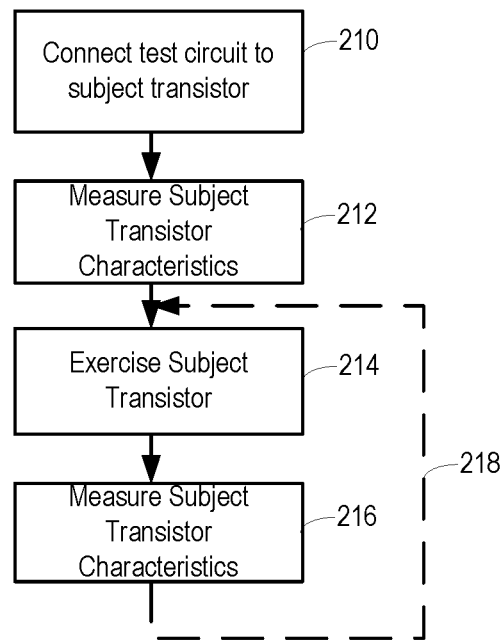
FIG. 2 is a flow chart illustrating a method for testing transistors.

FIG. 2 is a flowchart illustrating a method for testing transistors. In block 210, the system may connect the subject transistor 112 to the test circuit. The system may measure the transistor characteristics in block 212, for example using measurement circuit 116. Various characteristics may be measured such as gate to source voltage (Vgs), Power dissipation (Pd), or change in thermal resistance. This may be measured while the power supply 140 is active. The power supply 140 provides a low level current for measurement. For example, power supply 140 may provide 5 mA/V.

In block 214, the system may exercise the subject transistor 112. The subject transistor 112 may be exercised by activating the power supply 130. The power supply 130 may generate a wave signal to exercise the subject transistor using a higher current level than power supply 140. For example, power supply 130 may provide 1 A/V. Exercising the subject transistor will raise the temperature of the subject transistor and may affect the transistor characteristics.

In block 216, the system may again measure the subject transistor characteristics after the subject transistor is exercised. As discusser earlier, the various characteristics may be measured such as gate to source voltage (Vgs), Power dissipation (Pd), or change in thermal resistance. This may be measured while the power supply 140 is active and the power supply 130 is inactive. The power supply 140 may again provide a low level current for measurement (e.g. power supply 140 may provide 5 m A/V).

The process may be repeated, for example, in a loop as noted by line 218. In this manner, a look up table may be made or a formula generated that could map the various transistor characteristics at different temperatures (e.g. or levels of exercise).

Figure 3:
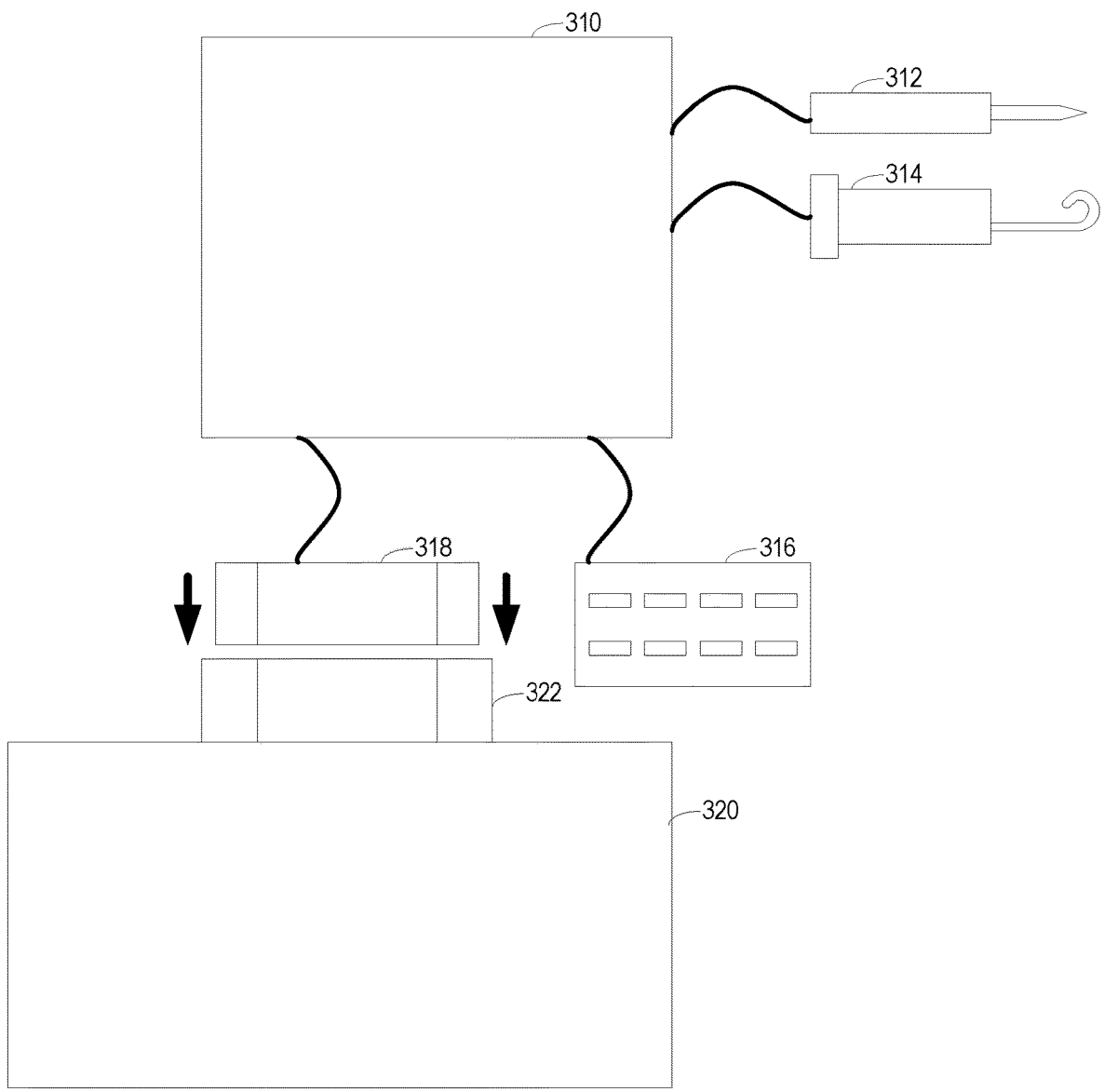
FIG. 3 is a block diagram of the system for testing transistors with various interfaces.

FIG. 3 is a block diagram of a system 310 for testing transistors with various interfaces. The system 310 may be used in multiple different scenarios for example during lab validation, in-line production, or for failure/root cause analysis. The system 310 may interface with the subject transistor in various manners. For example, the system 310 may include a socket 316 that may receive the leads of the subject transistor, the system 310 may include a connector 318 that plugs into a mating connector 322 of device 320 (e.g. a restraint control module) for diagnostic purposes, or the system 310 may include probes 312 or clips 314 to test a transistor in a device or soldered onto a board. Accordingly, the testing circuit can be adapted to many situations and may even be produced for testing on the same chip.

The methods, devices, processing, and logic described above may be implemented in many different ways and in many different combinations of hardware and software. For example, all or parts of the implementations may be circuitry that includes an instruction processor, such as a Central Processing Unit (CPU), microcontroller, or a microprocessor; an Application Specific Integrated Circuit (ASIC), Programmable Logic Device (PLD), or Field Programmable Gate Array (FPGA); or circuitry that includes discrete logic or other circuit components, including analog circuit components, digital circuit components or both; or any combination thereof. The circuitry may include discrete interconnected hardware components and/or may be combined on a single integrated circuit die, distributed among multiple integrated circuit dies, or implemented in a Multiple Chip Module (MCM) of multiple integrated circuit dies in a common package, as examples.

The circuitry may further include or access instructions for execution by the circuitry. The instructions may be stored in a tangible storage medium that is other than a transitory signal, such as a flash memory, a Random Access Memory (RAM), a Read Only Memory (ROM), an Erasable Programmable Read Only Memory (EPROM); or on a magnetic or optical disc, such as a Compact Disc Read Only Memory (CDROM), Hard Disk Drive (HDD), or other magnetic or optical disk; or in or on another machine-readable medium. A product, such as a computer program product, may include a storage medium and instructions stored in or on the medium, and the instructions when executed by the circuitry in a device may cause the device to implement any of the processing described above or illustrated in the drawings.

The implementations may be distributed as circuitry among multiple system components, such as among multiple processors and memories, optionally including multiple distributed processing systems. Parameters, databases, and other data structures may be separately stored and managed, may be incorporated into a single memory or database, may be logically and physically organized in many different ways, and may be implemented in many different ways, including as data structures such as linked lists, hash tables, arrays, records, objects, or implicit storage mechanisms. Programs may be parts (e.g., subroutines) of a single program, separate programs, distributed across several memories and processors, or implemented in many different ways, such as in a library, such as a shared library (e.g., a Dynamic Link Library (DLL)). The DLL, for example, may store instructions that perform any of the processing described above or illustrated in the drawings, when executed by the circuitry.

As a person skilled in the art will readily appreciate, the above description is meant as an illustration of the principles of this disclosure. This description is not intended to limit the scope or application of this disclosure in that the systems and methods are susceptible to modification, variation and change, without departing from spirit of this disclosure, as defined in the following claims.

The invention claimed is:

1. A system for testing a subject transistor with constant power; the system comprising:
   an amplifier having an output connected to a gate of the subject transistor, the amplifier having a first input and a second input, the second input of the amplifier is connected to a source of the subject transistor through a resistor;
   a measurement voltage source connected to the first input of the amplifier configured for use in measuring characteristics of the subject transistor;
   an exercise voltage source connected to the first input of the amplifier configured for exercising the subject transistor, wherein the exercise voltage source controls a second transistor to provide a second voltage to the first input of the amplifier;
   a second control amplifier where the exercise voltage source is connected to a first input of the second control amplifier and a second input of the second control amplifier is connected to a source of the second transistor.

2. The system according to claim 1, wherein a drain of subject transistor is connected to ground.

3. The system according to claim 1, wherein the measurement voltage source controls a first transistor to provide a first voltage to the first input of the amplifier.

4. The system according to claim 3, further comprising a first control amplifier where the measurement voltage source is connected to a first input of the first control amplifier and the second input of the first control amplifier is connected to a source of the first transistor.

5. The system according to claim 1, further comprising a power source connected to a node to generate a supply voltage.

6. The system according to claim 5, wherein the node is connected to a source of subject transistor through a first resistor.

7. The system according to claim 6, wherein the node is connected to the first input of the amplifier through a second resistor.

8. The system according to claim 1, wherein a capacitor and a resistor are connected in series between the output of the amplifier and a source of subject transistor.

9. A method for testing a subject transistor comprising the steps of:
   connecting a test circuit to the transistor;
   measuring a characteristic of the subject transistor using a measuring signal circuit of the test circuit;
   exercising the subject transistor using an exercising circuit of the test circuit; and
   measuring the characteristic of the subject transistor again using the measuring signal circuit of the test circuit;
   wherein the test circuit includes an amplifier having an output connected to a gate of the subject transistor, the amplifier having a first input and a second input, the second input of the amplifier is connected to a source of the subject transistor through a resistor; and
   wherein the exercise circuit includes: an exercise voltage source connected to the first input of the amplifier configured for exercising the subject transistor, wherein the exercise voltage source controls a second transistor to provide a second voltage to the first input of the amplifier; and a second control amplifier, where the exercise voltage source is connected to a first input of the second control amplifier and a second input of the second control amplifier is connected to a source of the second transistor.

10. The method according to claim 9, wherein the characteristic of the transistor measured is a gate to source voltage.

11. The method according to claim 9, wherein the characteristic of the transistor measured is a power dissipation across the transistor.

12. The method according to claim 9, wherein the characteristic of the transistor measured is a change in thermal resistance of the transistor.

13. The method according to claim 9, wherein exercising of the transistor and measurement occur iteratively.

14. The method according to claim 9, wherein a look up table is generated for the transistor identifying the characteristic at a given temperature.

15. The method according to claim 9, wherein the test circuit is connected to the transistor while mounted in a restraint module.

16. The method according to claim 9, wherein the transistor is plugged into a socket and test circuit is connected to the socket.

17. The method according to claim 9, wherein the test circuit and the transistor are formed on a same chip.

18. A system for testing a subject transistor with constant power; the system comprising:
   an amplifier having an output connected to a gate of the subject transistor, the amplifier having a first and a second input, the second input of the amplifier is connected to a source of the subject transistor through a resistor;
   a measurement voltage source connected to the first input of the amplifier; the measurement voltage source controlling a first transistor to provide a first voltage to the first input of the amplifier;
   a exercise voltage source connected to the first input of the amplifier, the exercise voltage source controlling a second transistor to provide a second voltage to the first input of the amplifier;
   a first control amplifier where the measurement voltage source is connected to a first input of the first control amplifier and the second input of the first control amplifier is connected to a source of the first transistor;
   a second control amplifier where the exercise voltage source is connected to a first input of the second control amplifier and the second input of the second control amplifier is connected to a source of the second transistor; and
   wherein a drain of subject transistor is connected to ground.

* * * * *